United States Patent [19]
Chaturvedi

[11] Patent Number: 5,977,850
[45] Date of Patent: Nov. 2, 1999

[54] MULTILAYER CERAMIC PACKAGE WITH CENTER GROUND VIA FOR SIZE REDUCTION

[75] Inventor: Rahul Chaturvedi, Albuquerque, N.Mex.

[73] Assignee: Motorola, Inc., Schaumburg, Ill.

[21] Appl. No.: 08/964,718

[22] Filed: Nov. 5, 1997

[51] Int. Cl.⁶ .............................. H01P 3/08; H01P 1/203; H01F 27/00
[52] U.S. Cl. .......................... 333/238; 333/162; 333/204; 336/200
[58] Field of Search ..................................... 333/185, 238, 333/246, 138, 140, 156, 161, 162, 163, 204; 336/200, 232; 174/262; 361/790, 792, 799

[56] References Cited

U.S. PATENT DOCUMENTS

| | | | |
|---|---|---|---|
| 4,614,922 | 9/1986 | Bauman et al. | 333/156 X |
| 5,032,815 | 7/1991 | Kobayashi et al. | 336/200 X |
| 5,057,798 | 10/1991 | Moye et al. | 333/33 |
| 5,359,315 | 10/1994 | Inoue et al. | 336/200 |
| 5,404,118 | 4/1995 | Okamura et al. | 333/185 X |
| 5,426,404 | 6/1995 | Kommrusch et al. | 333/162 X |
| 5,499,005 | 3/1996 | Gu et al. | 333/246 |
| 5,499,445 | 3/1996 | Boyle et al. | 29/830 |
| 5,552,752 | 9/1996 | Sturdivant et al. | 333/243 |
| 5,561,406 | 10/1996 | Ikata et al. | 333/185 X |
| 5,644,276 | 7/1997 | Sturzebecher et al. | 333/236 |
| 5,668,511 | 9/1997 | Furutani et al. | 333/204 |
| 5,812,038 | 9/1998 | Gu et al. | 333/185 X |
| 5,834,994 | 11/1998 | Shapiro | 333/185 X |

FOREIGN PATENT DOCUMENTS

| | | | |
|---|---|---|---|
| 2-189013 | 7/1990 | Japan | 333/140 |

Primary Examiner—Robert Pascal
Assistant Examiner—Barbara Summons
Attorney, Agent, or Firm—Gary J. Cunningham; Brian M. Mancini

[57] ABSTRACT

A multilayer ceramic package 200 with a center ground via 202 for size reduction is disclosed. Package 200 includes dielectric layers 204A–204G each having a major surface 206. The package also includes an input electrode 208 and an output electrode 210 as well as a top ground plane 212 and a bottom ground plane 214. Package 200 includes a substantially spiral transmission line structure made from electrodes 216. Package 200 also includes a ground via 202 extending vertically through the plurality of dielectric layers 204A–204G. The center ground via 202 is substantially centered inside the substantially spiral transmission line structure and electrically isolated therefrom and connected to the top ground plane 212 and the bottom ground plane 214.

20 Claims, 4 Drawing Sheets

— PRIOR ART —

— PRIOR ART —

MULTILAYER CERAMIC PACKAGE WITH CENTER GROUND VIA FOR SIZE REDUCTION

FIELD OF THE INVENTION

This invention relates to multilayer ceramic packages, and more particularly, to multilayer ceramic packages with a center ground via for size reduction.

BACKGROUND OF THE INVENTION

The placement of transmission lines for signal propagation through the various layers of a multilayer ceramic package is well known in the art. Such transmission lines are typically in the form of a conductive paste material (such as silver, gold, palladium, platinum or other metals) which is screen printed onto the layers of green ceramic tape which are then fired to form a dense, ceramic package.

Also of great interest to a designer of multilayer ceramic packages are the use of small holes in the sheets of ceramic, called vias, which are also filled with a conductive material. The vias serve the purpose of connecting the transmission lines on the various layers of ceramic through the multilayer package. Aside from merely connecting transmission lines on consecutive ceramic sheets, vias may also be used to connect the top and bottom ground planes in a ceramic package, for example. This is oftentimes necessary in order to keep the ground planes at equal potential. In any event, the strategic placement of vias and transmission lines in the ceramic package is one of the primary responsibilities of a multilayer package designer.

There are numerous factors which must be considered in the design of these multilayer packages. Printed lines and vias typically come in sizes and spacings that are standard to the industry. Printed lines and spacings have practical limitations. For example, 5 mil lines and 5 mil spacings are now readily achievable using typical multilayer processing equipment. Moreover, via diameters are also set by industry standards. Vias are typically 10 mils in diameter with the current technology. Of course, via diameters for various tapes will be a function of the tape thickness. Stated another way, for a given tape thickness, only certain sized vias may be properly filled with a conductive material.

If a via is too large, it may require a prohibitive amount of conductive paste to be properly filled and it may further weaken the mechanical integrity of the package. Conversely, if a via is too small, it may not be easily filled and it may cause a break in the conductive path which forms the transmission line.

Another concern is that by placing ground vias and transmission lines in too close a proximity to each other, they may interfere or interrupt the signal itself. For example, in a multilayer ceramic filter package, poor placement of transmission lines and vias may result in degradation of certain electrical properties such as insertion loss, return loss, or the Q (quality factor) of a transmission line. Poor placement of transmission lines and vias may also result in undesirable coupling, unintended electrical shorts, and unacceptable power requirements.

As is described above, the design of a multilayer package may be a complex process and formidable challenge. All of this is further complicated by the fact that the telecommunications industry is constantly seeking smaller packages, which have lower profiles and smaller package dimensions. Thus, designers are being forced to employ innovative designs to meet ever tightening specifications.

FIG. 1 shows a multilayer ceramic package 100 which is representative of a multilayer package found in the prior art. Referring to FIG. 1, package 100 is made from a set of sheets of ceramic material 102 which are laminated together to create a multilayer package. Patterns of conductive material are screen printed on to the various layers of the sheets of ceramic material to create a transmission line structure 104. Four vias 106A, 106B, 106C, and 106D form ground vias which connect a top ground plane 108 to a bottom ground plane 110. Significantly, the four ground vias 106A, 106B, 106C, and 106D are located outside and around the periphery of the transmission line structure.

FIG. 4A shows a plan view of a multilayer ceramic package also having ground vias outside a transmission line structure as is found in the prior art. Referring to FIG. 4A, a multilayer ceramic package 400 is provided. On one dielectric sheet 402, a printed pattern 404 is deposited. Other printed patterns, for example 405 shown as a dashed line in FIG. 4A, are printed on other layers of the multilayer ceramic package 400. The printed patterns are connected to form a transmission line structure. Four ground vias 406 are located around the outside of the transmission line. It should be noted that the area 408 internal to the transmission line does not contain any ground vias and remains as unused real estate on the dielectric sheet 402.

A multilayer ceramic package design in which a ground via is strategically placed through the center of another transmission line structure, namely, a substantially spiral shaped transmission line structure, which reduces the overall size of the multilayer package without adversely effecting the electrical performance of the package and which maintains the structural integrity of the package and which can be achieved using conventional multilayer processing techniques would be considered an improvement in the art.

DETAILED DESCRIPTION OF A PREFERRED EMBODIMENT

Figure 2:
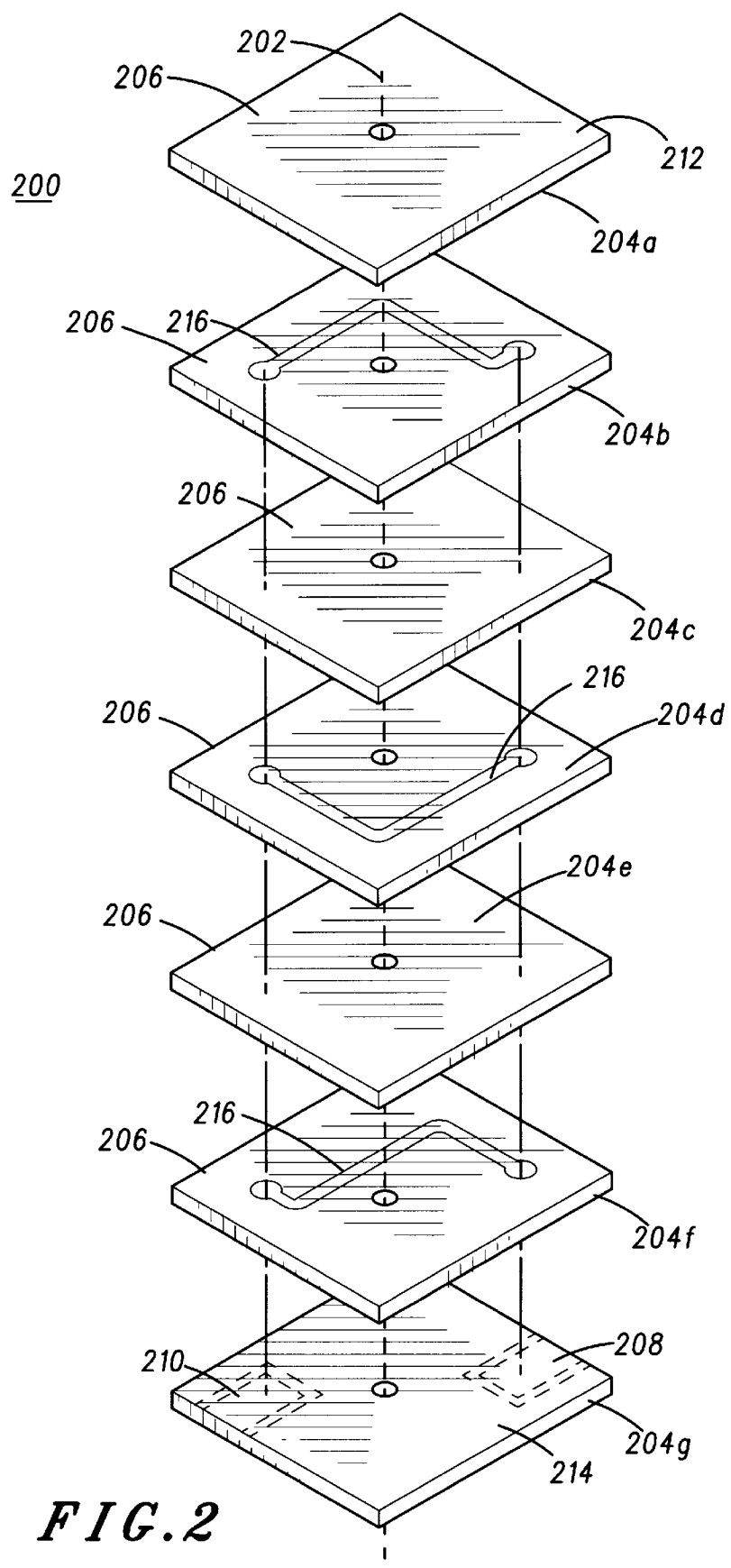
FIG. 2 shows an embodiment of a multilayer ceramic package with a center via for size reduction in accordance with the present invention.

FIG. 2 shows an embodiment of a multilayer ceramic package 200 with a center ground via 202 for size reduction. Referring to FIG. 2, the multilayer ceramic package contains multiple dielectric layers, 204A through 204G each having a major surface 206. Multilayer ceramic package 200 includes an input electrode 208 formed on the major surface of one of the dielectric layers and an output electrode 210 formed on the major surface of one of the dielectric layers. The multilayer ceramic package 200 also has a top ground plane 212 formed on the major surface of one of the dielectric layers and a bottom ground plane 214 formed on the major surface of one of the dielectric layers.

Contained embedded in the multilayer ceramic package 200 is a substantially spiral transmission line structure including a plurality of electrodes 216 formed on the some of the dielectric layers 204A through 204G. The dielectric layers 204A through 204G have metallized through holes formed therein defining vias (not shown). The electrodes 216 are connected to the input electrode 208 and the output electrode 210, and the electrodes 216 are connected to each other by the vias.

Multilayer ceramic package 200 also contains a center ground via 202 extending vertically through the dielectric layers (204A–204G) substantially perpendicular to the major surface 206 of each dielectric layer (204A–204G). Moreover, the center ground via 202 is substantially centered inside the substantially spiral transmission line structure and electrically isolated therefrom. The center ground via 202 is connected to both the top ground plane 212 and the bottom ground plane 214.

The design which incorporates a center ground via 202 through the center of a substantially spiral transmission line structure is innovative because it is counter-intuitive. Many multilayer package designers would expect such a design to adversely effect the electrical performance of the spiral transmission lines. In particular, the Quality Factor Q of the transmission line would likely be degraded. However, as the substantial measured data presented below reveals, a center ground via 202 may be designed into the package without adversely effecting the electrical properties of the transmission lines inside the multilayer ceramic package.

Figure 3:
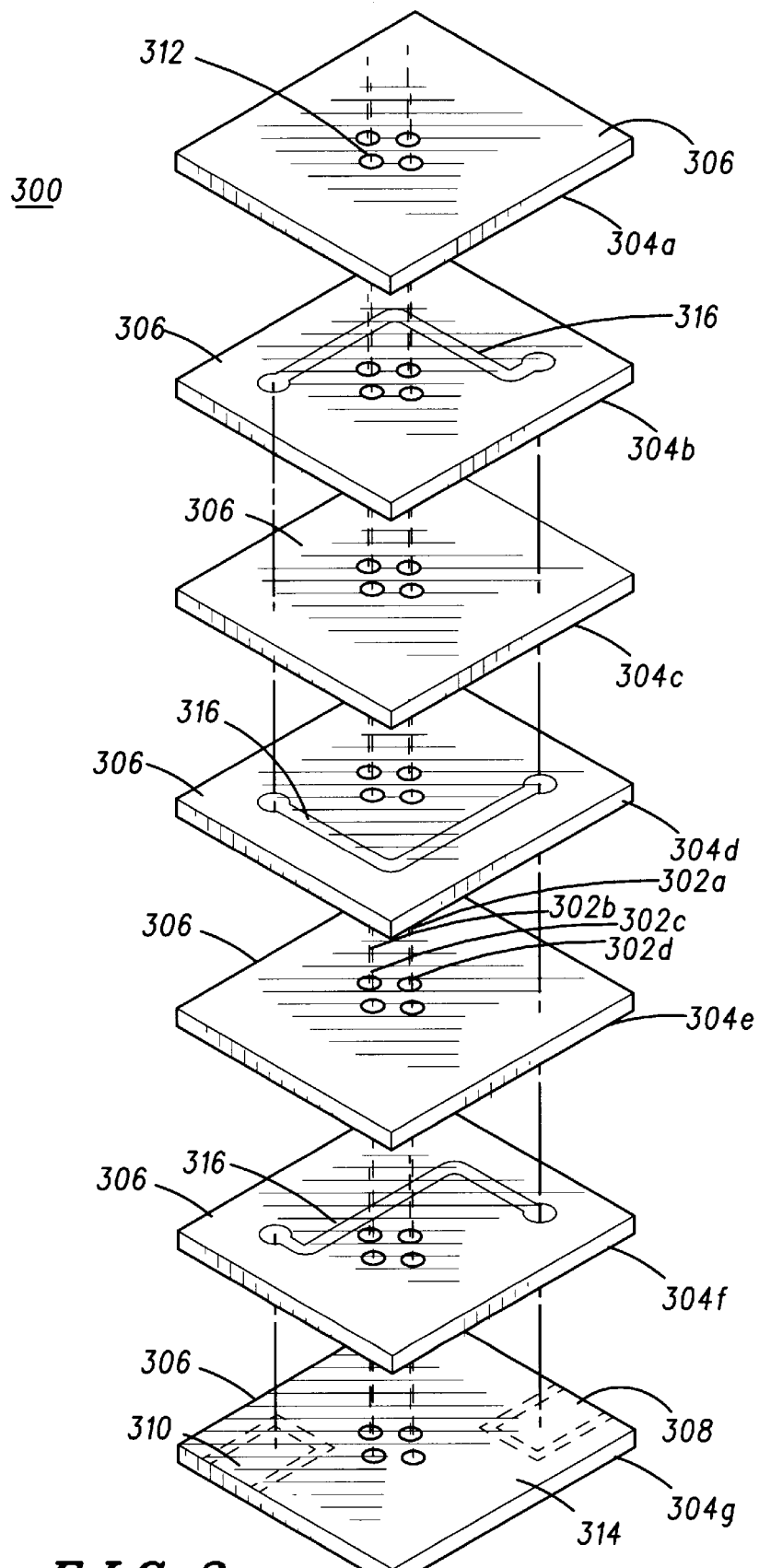
FIG. 3 shows another embodiment of a multilayer ceramic package with multiple center vias for size reduction in accordance with the present invention.

FIG. 3 shows another embodiment of a multilayer ceramic package 300 with multiple center ground vias 302A, 302B, 302C, and 302D. This design also achieves the desired size reduction while also having the advantage of improved grounding between the ground planes.

Referring to FIG. 3, the multilayer ceramic package contains multiple dielectric layers, 304A through 304G each having a major surface 306. Multilayer ceramic package 300 includes an input electrode 308 formed on the major surface of one of the dielectric layers and an output electrode 310 formed on the major surface of one of the dielectric layers. The multilayer ceramic package 300 also has a top ground plane 312 formed on the major surface of one of the dielectric layers and a bottom ground plane 314 formed on the major surface of one of the dielectric layers Contained embedded in the multilayer ceramic package 300 is a substantially spiral transmission line structure including a plurality of electrodes 316 formed on the some of the dielectric layers 304A through 304G. The dielectric layers 304A through 304G have metallized through holes formed therein defining vias (not shown). The electrodes 316 are connected to the input electrode 308 and the output electrode 310, and the electrodes 316 are connected to each other by the vias.

Multilayer ceramic package 300 also contains multiple center ground vias 302A–302D extending vertically through the dielectric layers (304A–304G) substantially perpendicular to the major surface 306 of each dielectric layer (304A–304G). Moreover, the center ground vias 302A–302D are substantially centered inside the substantially spiral transmission line structure and electrically isolated therefrom. The center ground vias 302A–302D are connected to both the top ground plane 312 and the bottom ground plane 314.

One advantage of the present invention is that it allows a multilayer package size to be reduced substantially. This is due to the fact that by placing the ground via through the center of the transmission line structure, previously unused real estate is utilized resulting in a smaller package size. Moreover, by incorporating this design, all three package dimensions (length, width, and height) may be practically reduced.

Figure 4A:
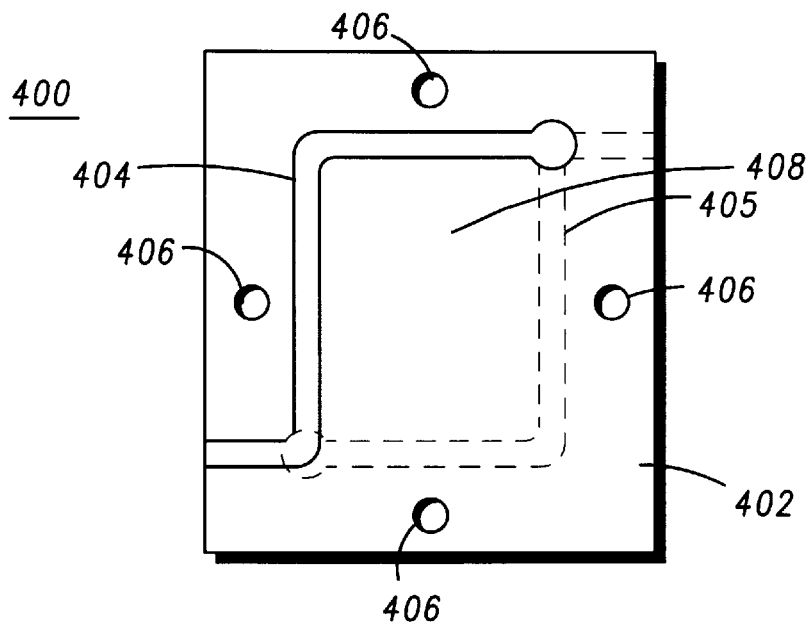
FIG. 4A shows a plan view of a multilayer ceramic package having ground vias outside a transmission line structure in accordance with the prior art.
Figure 4B:
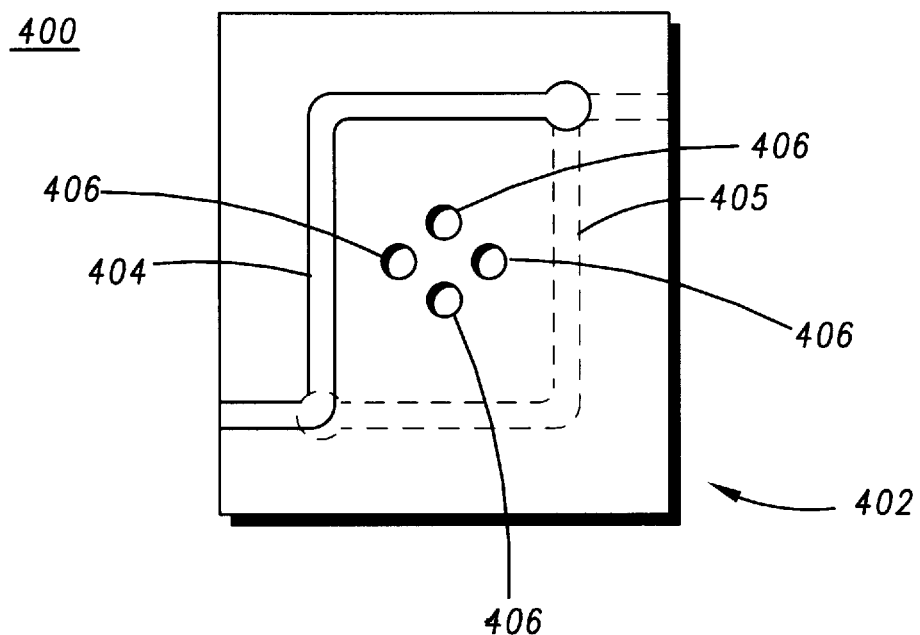
FIG. 4B shows a plan view of a multilayer ceramic package with multiple center vias for size reduction in accordance with the present invention.

The concept of a multilayer ceramic package with a center ground via for size reduction is also clearly presented in FIG. 4B. FIG. 4B shows a plan view of a multilayer ceramic package with multiple center vias. In FIG. 4B, a multilayer ceramic package 400 is provided. On one dielectric sheet 402, a printed pattern 404 is deposited. Other printed patterns, for example 405 shown as a dashed line in FIG. 4B, are printed on other layers of the multilayer ceramic package 400. The printed patterns are connected to form a transmission line structure. Four ground vias 406 are located inside the transmission line structure. This design allows the area outside the transmission line structure to be eliminated, thereby reducing the overall dimensions of the multilayer ceramic package 400.

Another subtle advantage of the present invention is that the substantial savings in space achieved by using the center ground via design is actually larger than the diameter of the ground via. This is due to the fact that during the via punching process, the sheets of green tape are somewhat deformed. In other words, as the sheets are punched using conventional processes, the area which becomes the via is removed and the walls which surround the new aperture actually deform elastically in the direction of the punching motion. This creates an area on the sheet, namely the area immediately surrounding the via, which may not be used for printed circuit designs such as transmission lines. In summary, by placing the center via inside the transmission line structure, the package dimensions may be reduced by an area that was formerly dedicated to the via. However, this area comprises both the via diameter as well as an apron surrounding the via. Thus, a substantial space savings may be achieved by relocating the ground via to substantially the center of the transmission line structure.

A basic tenet of multilayer package design is that the top and bottom ground planes must be connected. This maintains the ground planes at equal potential and renders the package balanced from an electrical perspective. It may be desirable, with certain designs, to actually place multiple vias through the center of the transmission line structure. As the number of vias connecting the ground plane increases, the package becomes less lossy, and this may be desirable for certain applications.

An important concern which must be addressed when a ground via is placed through the center of another transmission line structure is the effect that the center ground via will have on the electrical performance of the multilayer package. Preferably, the ground via should have no influence on the properties of the transmission lines. One important concern is the effect of the center ground via on the Q (quality factor) of the transmission line. Other factors such as the effect on insertion loss and return loss (impedance) are also important for many telecommunication applications. Whereas prior art multilayer package designs avoided placing the ground via in the strategic location of the present invention, the data presented below reveals that many important electrical properties were not adversely effected by the present design. This data is the result of electrical testing, over a wide range of frequencies, of two separate actual two-port passive device structures which were built. This data is presented in comparative example and table form below.

COMPARATIVE EXAMPLE ONE

A multilayer ceramic package without center ground vias was prepared and its electrical properties were measured.

Figure 1:
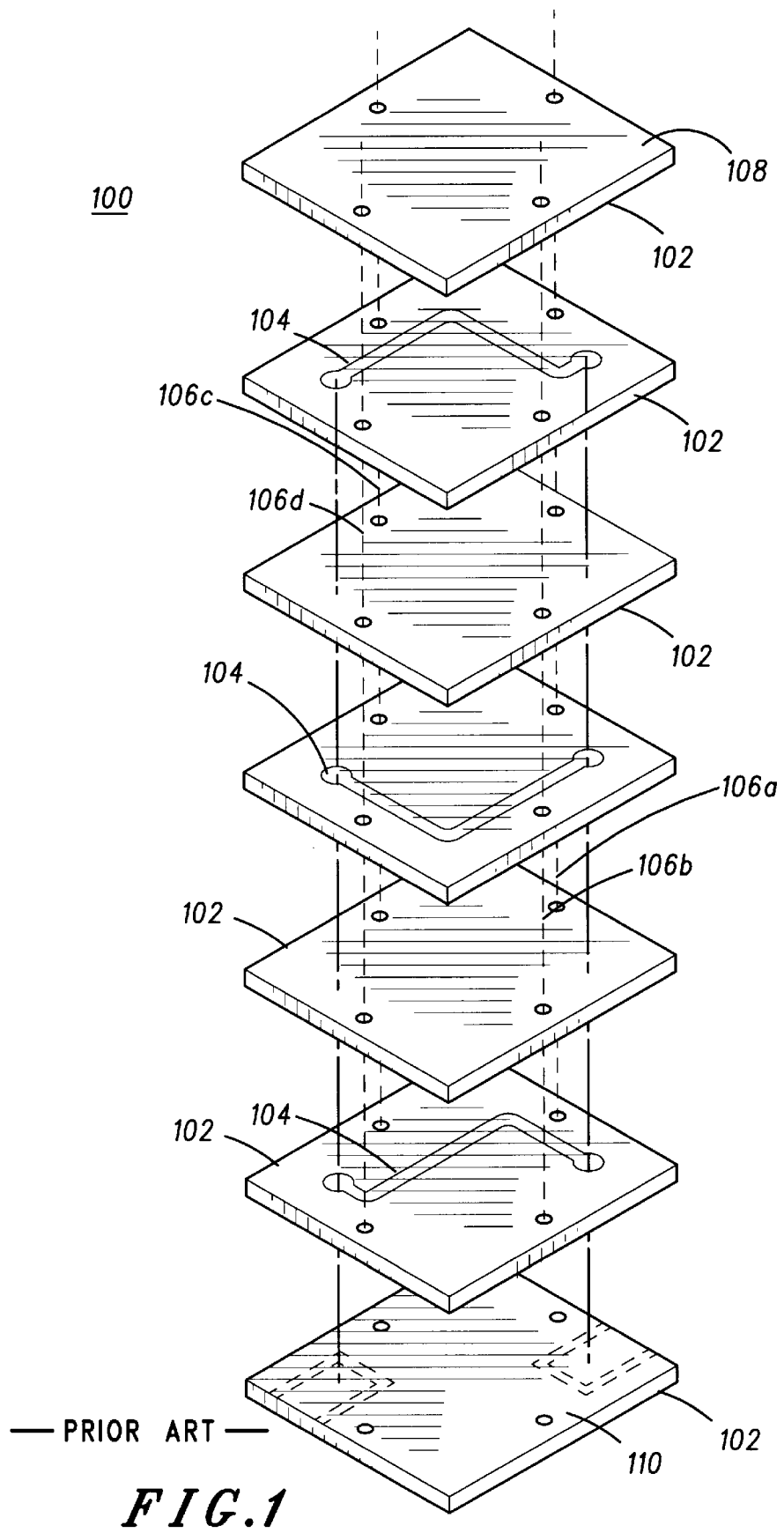
FIG. 1 shows a multilayer ceramic package having ground vias outside a transmission line structure in accordance with the prior art.

This multilayer ceramic package was 170 mils in length, 150 mils in width and 37 mils in height. The package was substantially the same as the multilayer ceramic package shown in FIG. 1 (labeled prior art). The package consisted of 10 layers (some layers were combined in FIG. 1). Inside this multilayer package, a substantially spiral transmission line structure was placed which consisted of three half-turn transmission line printed lines on three of the dielectric layers. The test package also included an input and an output electrode on a bottom layer as well as top and bottom ground planes. The printed lines had an inner diameter of 70 mils by 70 mils and an outer diameter of 90 mils by 90 mils. The printed lines had a width of 10 mils. Around the outside of the substantially spiral transmission line structure were placed four ground vias connecting the top and bottom ground planes. These vias were 10 mils in diameter and were placed in a peripheral design around the transmission line structure.

From this multilayer package, electrical properties were measured at 63 separate frequencies ranging from 500 MHz to 2980 MHz. The return loss (measured in dB) and its corresponding phase (measured in degrees) as well as the insertion loss (measured in dB) and its corresponding phase (measured in degrees) for the multilayer test package were measured. These electrical properties are presented in Table 1 below:

TABLE 1

Multilayer Ceramic Package Without Center Ground Vias

| Sample # | Frequency of Measurement (MHz) | Return Loss (dB) | Phase (deg) | Insertion Loss (dB) | Phase (deg) |
|---|---|---|---|---|---|
| 1 | 500 | −43.816 | 12.464 | −0.033 | −22.151 |
| 2 | 540 | −43.418 | 11.451 | −0.038 | −23.899 |
| 3 | 580 | −42.377 | 8.264 | −0.046 | −25.692 |
| 4 | 620 | −41.709 | 9.692 | −0.048 | −27.440 |
| 5 | 660 | −41.279 | 6.990 | −0.043 | −29.246 |
| 6 | 700 | −40.243 | 3.603 | −0.037 | −30.945 |
| 7 | 740 | −39.555 | 3.749 | −0.044 | −32.779 |
| 8 | 780 | −38.985 | −0.934 | −0.041 | −34.655 |
| 9 | 820 | −37.856 | −2.125 | −0.059 | −36.405 |
| 10 | 860 | −37.510 | −1.968 | −0.048 | −38.148 |
| 11 | 900 | −36.479 | −5.479 | −0.070 | −40.107 |
| 12 | 940 | −35.749 | −4.957 | −0.053 | −41.723 |
| 13 | 980 | −35.303 | −7.938 | −0.056 | −43.719 |
| 14 | 1020 | −34.308 | −11.881 | −0.078 | −45.497 |
| 15 | 1060 | −33.632 | −11.318 | −0.061 | −47.258 |
| 16 | 1100 | −33.145 | −15.769 | −0.090 | −49.242 |
| 17 | 1140 | −32.464 | −18.272 | −0.096 | −50.940 |
| 18 | 1180 | −32.067 | −17.032 | −0.072 | −52.769 |
| 19 | 1220 | −31.561 | −21.177 | −0.100 | −54.625 |
| 20 | 1260 | −30.978 | −22.212 | −0.102 | −56.286 |
| 21 | 1300 | −30.713 | −22.940 | −0.079 | −58.375 |
| 22 | 1340 | −30.179 | −26.023 | −0.116 | −59.980 |
| 23 | 1380 | −29.550 | −25.219 | −0.076 | −61.924 |
| 24 | 1420 | −29.350 | −25.954 | −0.127 | −63.955 |
| 25 | 1460 | −28.637 | −27.001 | −0.106 | −65.527 |
| 26 | 1500 | −28.212 | −26.556 | −0.090 | −67.567 |
| 27 | 1540 | −27.833 | −27.447 | −0.126 | −69.384 |
| 28 | 1580 | −27.136 | −28.067 | −0.110 | −71.203 |
| 29 | 1620 | −26.848 | −27.432 | −0.100 | −73.239 |
| 30 | 1660 | −26.334 | −29.246 | −0.137 | −74.945 |
| 31 | 1700 | −25.721 | −28.727 | −0.109 | −76.906 |
| 32 | 1740 | −25.388 | −28.469 | −0.151 | −78.955 |
| 33 | 1780 | −24.746 | −29.023 | −0.119 | −80.580 |
| 34 | 1820 | −24.137 | −28.924 | −0.143 | −82.926 |
| 35 | 1860 | −23.821 | −29.904 | −0.129 | −84.353 |
| 36 | 1900 | −23.249 | −30.470 | −0.119 | −86.615 |
| 37 | 1940 | −22.732 | −30.371 | −0.140 | −88.531 |
| 38 | 1980 | −22.331 | −31.156 | −0.144 | −90.628 |
| 39 | 2020 | −21.687 | −31.835 | −0.152 | −92.706 |
| 40 | 2060 | −21.272 | −32.109 | −0.172 | −94.680 |

TABLE 1-continued

Multilayer Ceramic Package Without Center Ground Vias

| Sample # | Frequency of Measurement (MHz) | Return Loss (dB) | Phase (deg) | Insertion Loss (dB) | Phase (deg) |
|---|---|---|---|---|---|
| 41 | 2100 | −20.863 | −32.966 | −0.142 | −96.598 |
| 42 | 2140 | −20.306 | −33.933 | −0.166 | −98.812 |
| 43 | 2180 | −20.011 | −33.846 | −0.166 | −100.523 |
| 44 | 2220 | −19.548 | −35.091 | −0.153 | −102.929 |
| 45 | 2260 | −19.036 | −35.346 | −0.231 | −104.733 |
| 46 | 2300 | −18.627 | −35.857 | −0.176 | −106.859 |
| 47 | 2340 | −18.183 | −37.001 | −0.227 | −109.059 |
| 48 | 2380 | −17.686 | −37.373 | −0.202 | −110.950 |
| 49 | 2420 | −17.328 | −38.221 | −0.222 | −113.035 |
| 50 | 2460 | −16.894 | −39.234 | −0.236 | −115.381 |
| 51 | 2500 | −16.462 | −39.956 | −0.266 | −117.256 |
| 52 | 2540 | −16.150 | −41.057 | −0.213 | −119.562 |
| 53 | 2580 | −15.687 | −42.592 | −0.325 | −121.775 |
| 54 | 2620 | −15.299 | −43.050 | −0.237 | −123.393 |
| 55 | 2660 | −14.931 | −44.238 | −0.321 | −126.324 |
| 56 | 2700 | −14.555 | −45.317 | −0.316 | −127.790 |
| 57 | 2740 | −14.227 | −46.153 | −0.295 | −130.482 |
| 58 | 2780 | −13.867 | −47.883 | −0.382 | −132.648 |
| 59 | 2820 | −13.458 | −48.825 | −0.367 | −134.699 |
| 60 | 2860 | −13.189 | −49.950 | −0.365 | −137.223 |
| 61 | 2900 | −12.885 | −51.830 | −0.447 | −139.266 |
| 62 | 2940 | −12.484 | −52.595 | −0.395 | −141.392 |
| 63 | 2980 | −12.227 | −54.133 | −0.457 | −144.061 |

COMPARATIVE EXAMPLE TWO

A second multilayer ceramic package with four (4) center ground vias was prepared and its electrical properties were also measured. This multilayer ceramic package was also 170 mils in length, 150 mils in width and 37 mils in height. The package was substantially the same as the multilayer ceramic package shown in FIG. 3. The package consisted of 10 layers (some layers were combined in FIG. 3). Inside this multilayer package, a substantially spiral transmission line structure was placed which consisted of three half-turn transmission line printed lines on three of the dielectric layers. The test package also included an input and an output electrode on a bottom layer as well as top and bottom ground planes. The printed lines had an inner diameter of 70 mils by 70 mils and an outer diameter of 90 mils by 90 mils. The printed lines had a width of 10 mils. Inside the substantially spiral transmission line structure were placed four (4) ground vias connecting the top and bottom ground planes. These vias were 10 mils in diameter and were placed 10 mils apart from each other.

From this second multilayer package, electrical properties were also measured at 63 separate frequencies ranging from 500 MHz to 2980 MHz. The Return Loss (measured in dB) and its corresponding Phase (measured in degrees) as well as the Insertion Loss (measured in dB) and its corresponding Phase (measured in degrees) for the second multilayer test package were measured. These electrical properties are presented in Table 2 below:

TABLE 2

Multilayer Ceramic Package With Four Center Ground Vias

| Sample # | Frequency of Measurement (MHz) | Return Loss (dB) | Phase (deg) | Insertion Loss (dB) | Phase (deg) |
|---|---|---|---|---|---|
| 1 | 500 | −42.639 | 27.693 | −0.035 | −22.211 |
| 2 | 540 | −42.140 | 26.872 | −0.040 | −23.973 |
| 3 | 580 | −41.346 | 23.980 | −0.043 | −25.720 |
| 4 | 620 | −40.557 | 24.425 | −0.043 | −27.447 |
| 5 | 660 | −40.173 | 22.002 | −0.038 | −29.264 |
| 6 | 700 | −39.297 | 18.697 | −0.034 | −31.061 |
| 7 | 740 | −38.664 | 18.367 | −0.036 | −32.879 |
| 8 | 780 | −38.272 | 14.309 | −0.045 | −34.722 |
| 9 | 820 | −37.226 | 12.206 | −0.059 | −36.534 |
| 10 | 860 | −36.885 | 13.038 | −0.047 | −38.295 |
| 11 | 900 | −36.022 | 8.746 | −0.058 | −40.248 |
| 12 | 940 | −35.231 | 8.838 | −0.054 | −41.835 |
| 13 | 980 | −34.973 | 6.457 | −0.068 | −43.826 |
| 14 | 1020 | −34.111 | 2.020 | −0.078 | −45.580 |
| 15 | 1060 | −33.383 | 2.392 | −0.074 | −47.367 |
| 16 | 1100 | −33.049 | −1.424 | −0.082 | −49.363 |
| 17 | 1140 | −32.339 | −3.529 | −0.092 | −51.037 |
| 18 | 1180 | −31.774 | −2.563 | −0.076 | −52.834 |
| 19 | 1220 | −31.317 | −6.974 | −0.096 | −54.730 |
| 20 | 1260 | −30.670 | −8.251 | −0.101 | −56.441 |
| 21 | 1300 | −30.352 | −9.151 | −0.069 | −58.540 |
| 22 | 1340 | −29.896 | −12.376 | −0.113 | −60.195 |
| 23 | 1380 | −29.131 | −12.458 | −0.071 | −62.040 |
| 24 | 1420 | −28.880 | −13.233 | −0.115 | −64.099 |
| 25 | 1460 | −28.191 | −14.887 | −0.104 | −65.711 |
| 26 | 1500 | −27.687 | −14.949 | −0.090 | −67.843 |
| 27 | 1540 | −27.304 | −16.220 | −0.126 | −69.621 |
| 28 | 1580 | −26.599 | −17.439 | −0.104 | −71.480 |
| 29 | 1620 | −26.207 | −17.376 | −0.099 | −73.449 |
| 30 | 1660 | −25.742 | −19.710 | −0.139 | −75.254 |
| 31 | 1700 | −25.103 | −20.313 | −0.088 | −77.289 |
| 32 | 1740 | −24.788 | −20.361 | −0.153 | −79.311 |
| 33 | 1780 | −24.217 | −21.298 | −0.114 | −80.981 |
| 34 | 1820 | −23.611 | −21.738 | −0.149 | −83.141 |
| 35 | 1860 | −23.294 | −22.876 | −0.126 | −84.813 |
| 36 | 1900 | −22.760 | −23.814 | −0.121 | −86.964 |
| 37 | 1940 | −22.229 | −23.893 | −0.141 | −88.992 |
| 38 | 1980 | −21.843 | −25.051 | −0.140 | −91.091 |
| 39 | 2020 | −21.258 | −26.036 | −0.162 | −93.016 |
| 40 | 2060 | −20.809 | −26.460 | −0.174 | −95.070 |
| 41 | 2100 | −20.404 | −27.676 | −0.156 | −96.859 |
| 42 | 2140 | −19.866 | −28.866 | −0.167 | −99.239 |
| 43 | 2180 | −19.568 | −28.966 | −0.176 | −101.012 |
| 44 | 2220 | −19.163 | −30.300 | −0.155 | −103.399 |
| 45 | 2260 | −18.654 | −30.900 | −0.235 | −105.297 |
| 46 | 2300 | −18.222 | −31.535 | −0.174 | −107.258 |
| 47 | 2340 | −17.773 | −33.031 | −0.238 | −109.528 |
| 48 | 2380 | −17.290 | −33.522 | −0.222 | −111.332 |
| 49 | 2420 | −16.950 | −34.365 | −0.225 | −113.559 |
| 50 | 2460 | −16.524 | −35.605 | −0.239 | −115.885 |
| 51 | 2500 | −16.092 | −36.498 | −0.275 | −117.736 |
| 52 | 2540 | −15.798 | −37.836 | −0.221 | −120.129 |
| 53 | 2580 | −15.364 | −39.552 | −0.344 | −122.273 |
| 54 | 2620 | −14.973 | −39.991 | −0.259 | −124.019 |
| 55 | 2660 | −14.623 | −41.629 | −0.332 | −126.887 |
| 56 | 2700 | −14.258 | −42.604 | −0.330 | −128.349 |
| 57 | 2740 | −13.933 | −43.581 | −0.302 | −131.191 |
| 58 | 2780 | −13.608 | −45.342 | −0.395 | −133.227 |
| 59 | 2820 | −13.206 | −46.561 | −0.375 | −135.330 |
| 60 | 2860 | −12.936 | −47.806 | −0.388 | −137.653 |
| 61 | 2900 | −12.663 | −49.709 | −0.461 | −139.836 |
| 62 | 2940 | −12.248 | −50.577 | −0.413 | −142.009 |
| 63 | 2980 | −12.011 | −52.164 | −0.475 | −144.720 |

The purpose of measuring the electrical properties of the two multilayer ceramic packages was to determine whether redesigning the package such that the ground vias extended through the center of the substantially spiral transmission line structure rather than around the periphery of the substantially spiral transmission line structure would adversely effect on the electrical properties.

Analysis of the measured data reveals that with all other factors being substantially the same, the design of a center ground via through a substantially spiral transmission line structure does not adversely effect the electrical properties of the ceramic multilayer package.

Referring to the Return Loss values for the two packages at 500 MHz (Sample number 1), the package without the center ground vias measured a value of −43.816 dB whereas the package with the four center ground vias measured a value of −42.639 dB. These Return Loss values were very close to each other for each measured frequency up to 2980 MHz (Sample number 63) where the package without the center ground vias measured −12.227 dB and the package with the four center ground vias measured a value of −12.011 dB.

Referring next to the Insertion Loss values at 500 MHz (Sample Number 1), the package without the center ground vias (Table 1) measured −0.033 dB whereas the package with the four center ground vias measured −0.035 dB. At 2980 MHz (Sample Number 63), the package without the center ground via (Table 1) measured −0.457 dB and the package with the four ground vias measured −0.475 dB.

From a multilayer package design perspective, these values are substantially the same. In other words, minor design changes could be made to the package while keeping these values numerically identical. Stated another way, the values for the electrical properties are not identical, however, they are interchangeable for the intended purposes and applications.

Thus, it is believed that since substantially identical electrical properties may be realized by placing the ground vias through the center of the substantially spiral transmission line structure, a significant reduction in the size of the multilayer package may be achieved. This is because real estate on the dielectric sheets, formerly dedicated to the periphery ground vias, may now be eliminated. Thus, the external dimensions of the multilayer package will be reduced while the ground vias, which now extend through the center of the substantially spiral transmission line structure, will still perform their desired objective, namely connecting the top and bottom ground planes.

The present invention may be applied to any substantially spiral transmission line structure. The center ground via design may be employed with any spiral, helical, circular, annular, U-shaped, or rectangular-helix shaped transmission line design. In fact, the scope of the present invention intends to include a substantially vertical center ground via which connects the ground planes between any partially or fully enclosed transmission line design. Additionally, it should be noted that the element formed by the transmission line structure may also vary and can provide a part of at least one of a mixer, an amplifier, or a voltage controlled oscillator in a cellular telephone. For example, it may be desirable to place a center ground via through a helical resonator, a spiral inductor, or any other embedded feature in a multilayer ceramic package.

One important design consideration involves how closely the center ground via may be placed relative to the transmission lines, or, conversely, how closely the transmission lines may be placed relative to the center ground via. It is desirable to bring these two components of the package as close together as is practically necessary so long as they do not physically touch and so long as they do not significantly interfere with each others function. Once again, other practical design considerations, such as line spacings and print tolerances, as well as via diameters, will limit the proximity of the center ground via and the transmission lines.

In one preferred embodiment of the present invention, the center ground via is strategically placed inside the transmission line structure such that it serves its intended purpose of connecting the top and bottom ground planes without interfering with the electrical properties of the transmission line structure. To achieve this desired result, the distance from the ground via to the substantially spiral transmission line structure may be greater than or equal to the distance from the substantially spiral transmission line structure to the top or bottom ground plane. This is necessary in order to insure proper isolation of the circuitry inside the multilayer package.

In another computer simulated design in which the distance from the ground via to the transmission line structure was much greater than the distance from the transmission line structure to the ground plane (6:1), the electrical properties of the transmission line structure were not adversely effected. In summary, the computer simulations, in conjunction with the working models that were made, support the conclusion that placing the center ground via through the transmission line structure is a viable design alternative.

It should be noted that the present invention is applicable primarily to narrow to moderate bandwidth applications. In a preferred embodiment, the present invention will be most readily applied to a multilayer ceramic package which is designed to operate at the frequencies of interest described in Tables 1 and 2, more specifically 500–2980 MHz. Of course, the scope of the present invention is not intended to be limited to this frequency range. In fact, the present invention contemplates a multilayer ceramic package with a center ground via at any frequency in which size reduction may be feasible.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A multilayer ceramic package, comprising:
   a plurality of dielectric layers each having a major surface, including:
     an input electrode formed on the major surface of one of the dielectric layers;
     an output electrode formed on the major surface of one of the dielectric layers;
     a top ground plane formed on the major surface of one of the dielectric layers;
     a bottom ground plane formed on the major surface of one of the dielectric layers;
   a substantially spiral transmission line structure including a plurality of electrodes formed on the plurality of dielectric layers, the plurality of dielectric layers having a plurality of metallized through holes formed therein defining vias, the electrodes being connected to the input electrode and the output electrode and the electrodes being connected to each other by the vias; and
   at least one center ground via extending vertically through the plurality of dielectric layers substantially perpendicular to the major surface of each dielectric layer, the at least one center ground via substantially centered inside the substantially spiral transmission line structure and electrically isolated therefrom and connected to the top ground plane and the bottom ground plane such that dimensions of the multilayer ceramic package are smaller than a multilayer ceramic package having equivalent electrical performance without using center ground vias.

2. The multilayer ceramic package of claim 1, wherein the substantially spiral transmission line structure provides a resonator for a filtering device.

3. The multilayer ceramic package of claim 1, wherein the substantially spiral transmission line structure provides a radio frequency device.

4. The multilayer ceramic package of claim 1, wherein the substantially spiral transmission line structure provides a matching device.

5. The multilayer ceramic package of claim 1, wherein the substantially spiral transmission line structure provides a part of at least one of a mixer, an amplifier, and a voltage controlled oscillator in a cellular telephone.

6. The multilayer ceramic package of claim 1, wherein the substantially spiral transmission line structure comprises a conductive annulus on the plurality of dielectric layers.

7. The multilayer ceramic package of claim 1, wherein the substantially spiral transmission line structure comprises a helical transmission line.

8. The multilayer ceramic package of claim 1, wherein the substantially spiral transmission line structure comprises a U-shaped transmission line.

9. The multilayer ceramic package of claim 1, wherein the center ground via is about 10 mils in diameter.

10. The multilayer ceramic package of claim 1, wherein the center ground via is about 5 mils in diameter.

11. The multilayer ceramic package of claim 1, wherein the center ground via is about 20 mils in diameter.

12. The multilayer ceramic package of claim 1, further comprising a plurality of center ground vias inside the substantially spiral transmission line structure.

13. The multilayer ceramic package of claim 1, wherein the center ground via does not effect the quality factor Q of the substantially spiral transmission line structure.

14. The multilayer ceramic package of claim 1, wherein the center ground via is substantially centered inside any fully or partially enclosed transmission line structure.

15. The multilayer ceramic package of claim 1, wherein a distance from the center ground via to the substantially spiral transmission line structure is greater than or equal to a distance from the substantially spiral transmission line structure to the top or bottom ground plane.

16. A multilayer ceramic package, comprising:
   a plurality of dielectric layers each having a major surface, including:
     an input electrode formed on the major surface of one of the dielectric layers;
     an output electrode formed on the major surface of one of the dielectric layers;
     a top ground plane formed on the major surface of one of the dielectric layers;
     a bottom ground plane formed on the major surface of one of the dielectric layers;
   a substantially spiral transmission line structure including a plurality of electrodes formed on the plurality of dielectric layers, the plurality of dielectric layers having a plurality of metallized through holes formed therein defining vias, the electrodes being connected to the input electrode and the output electrode and the electrodes being connected to each other by the vias and the substantially spiral transmission line structure having an inner diameter of about 0.030 inches,
   a center ground via extending vertically through the plurality of dielectric layers substantially perpendicular to the major surface of each dielectric layer, the center ground via substantially centered inside the substantially spiral transmission line structure and electrically isolated therefrom and having a diameter of about 0.010 inches and connected to the top ground plane and the bottom ground plane.

17. The multilayer ceramic package of claim 16, further comprising a plurality of center ground vias inside the substantially spiral transmission line structure.

18. The multilayer ceramic package of claim 16, wherein a distance from the center ground via to the substantially spiral transmission line structure is greater than or equal to a distance from the substantially spiral transmission line structure to the top or bottom ground plane.

19. The multilayer ceramic package of claim 16, wherein the substantially spiral transmission line structure provides a radio frequency device.

20. The multilayer ceramic package of claim 16, wherein the center ground via is substantially centered inside any fully or partially enclosed transmission line structure.

* * * * *